United States Patent
Teh et al.

(10) Patent No.: US 7,999,575 B2
(45) Date of Patent: Aug. 16, 2011

(54) SEMICONDUCTOR INTEGRATED CIRCUIT DEVICE

(75) Inventors: Chenkong Teh, Tokyo (JP); Hiroyuki Hara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/701,730

(22) Filed: Feb. 8, 2010

(65) Prior Publication Data
US 2010/0315127 A1    Dec. 16, 2010

(30) Foreign Application Priority Data

Jun. 10, 2009   (JP) ................................. 2009-139452

(51) Int. Cl.
*H03K 19/20* (2006.01)
*H03K 19/096* (2006.01)
*H03K 3/356* (2006.01)
(52) U.S. Cl. ........................... 326/112; 326/95; 327/210
(58) Field of Classification Search .................... 326/82, 326/83, 86, 87, 93–95; 327/108, 109
See application file for complete search history.

(56) References Cited

U.S. PATENT DOCUMENTS

| | | | | |
|---|---|---|---|---|
| 4,563,594 A * | 1/1986 | Koyama | .......................... | 327/206 |
| 5,548,229 A * | 8/1996 | Segawa et al. | .................... | 326/57 |
| 5,592,104 A * | 1/1997 | Bach | ................. | 326/27 |
| 5,905,393 A * | 5/1999 | Rinderknecht et al. | ........ | 327/202 |
| 6,246,259 B1 * | 6/2001 | Zaliznyak et al. | .............. | 326/41 |
| 6,784,694 B2 * | 8/2004 | Kim et al. | ......................... | 326/95 |
| 6,788,586 B2 * | 9/2004 | Confalonieri et al. | ... | 365/189.05 |
| 7,321,243 B1 * | 1/2008 | Qureshi et al. | ................. | 326/121 |
| 2001/0054917 A1 * | 12/2001 | Onishi | ........................... | 327/108 |
| 2005/0083082 A1 * | 4/2005 | Olofsson | ........................ | 326/95 |

OTHER PUBLICATIONS

Partovi, et al. Flow-Through Latch and Edge-Triggered Flip-flop Hybrid Elements, ISSCC96/Session 8/Digital Clocks and Latches/Paper FA 8.5, Feb. 9, 1996, pp. 138-139.
Klass. Semi-Dynamic and Dynamic Flip-Flops with Embedded Logic, 1998 Symposium on VLSI Circuits Digest of Technical Papers, pp. 108-109.
Kong, et al. Conditional-Capture Flip-Flop for Statistical Power Reduction, IEEE Journal of Solid-State Circuits, vol. 36, No. 8, Aug. 2001, pp. 1263-1271.

* cited by examiner

*Primary Examiner* — Rexford N Barnie
*Assistant Examiner* — Dylan White
(74) *Attorney, Agent, or Firm* — Turocy & Watson, LLP

(57) ABSTRACT

A semiconductor integrated circuit device includes: a first inverter constituted by a first transistor configured to charge a charge point based on an input signal, and a second transistor configured to discharge a discharge point based on the input signal; a P-type third transistor and an N-type fourth transistor with drain-source paths provided in parallel between the charge point and the discharge point; and a second inverter configured to invert a potential of the charge point or the discharge point and supply the inverted potential to gates of the third and fourth transistors, and obtain a delay signal of the input signal from the charge point or the discharge point. The semiconductor integrated circuit device secures a sufficient delay time with a small area.

20 Claims, 12 Drawing Sheets

SEMICONDUCTOR INTEGRATED CIRCUIT DEVICE

CROSS-REFERENCE TO RELATED APPLICATION

This application is based upon and claims the benefit of priority from the prior Japanese Patent Application No. 2009-139452 filed in Japan on Jun. 10, 2009; the entire contents of which are incorporated herein by reference.

BACKGROUND OF THE INVENTION

1. Field of the Invention

The present invention relates to a semiconductor integrated circuit device that is suitable for a pulse-triggered flip-flop circuit.

2. Description of Related Art

Flip-flop circuits are widely used in integrated circuits such as LSIs. Flip-flop circuits include synchronous type circuits and non-synchronous type circuits. In a synchronous type flip-flop circuit an output is changed synchronously with a clock signal input. Synchronous type flip-flop circuits include various types of circuits such as a master-slave flip-flop circuit and a pulse-triggered flip-flop circuit.

A pulse-triggered flip-flop circuit is a circuit that changes an output only in a narrow-width pulse period that is synchronized with a clock signal input. Since a setup time and a delay time in this kind of pulse-triggered flip-flop are small, recently pulse-triggered flip-flops are often used in high-end processors.

Pulse-triggered flip-flops include an HLFF (Hybrid Latch F/F), an SDFF (Semi-dynamic F/F), a CCFF (Conditional Capture F/F), and a DMFF (Data Mapping F/F) as respectively described in the following literature:

Partovi, H., et al., "Flow-Through Latch and Edge-Triggered Flip-Flop Hybrid Elements," in ISSCC Dig. Tech. Papers, February 1996, pp. 138-139 (hereunder referred to as "Document 1");

Klass, F., "Semi-Dynamic and Dynamic Flip-Flops with Embedded Logic," in Symp. VLSI Circuits Dig. Tech. Papers, June 1998, pp. 108-109 (hereunder, referred to as "Document 2"); and B.-S. Kong, S.-S Kim, Y.-H. Jim, "Conditional-Capture Flip-Flop for Statistical Power Reduction," IEEE J. Solid-State Circuits, vol. 36, pp. 1263-1271, August 2001 (hereunder referred to as "Document 3").

With a pulse-triggered flip-flop it is necessary to define a narrow-width pulse period that is synchronized with a clock signal input as the internal timing, and it is also necessary to secure a timing width that has some margin with respect to fluctuations in PVT (process, power supply voltage, temperature) conditions.

This kind of internal timing interval, that is, internal timing width, can be obtained using an inverter that delays a clock signal input. A required delay amount can be obtained according to the number of inverters that are connected in cascade. More specifically, in the case of pulse-triggered flip-flops, a sufficient number of inverters are necessary in order to secure the required internal timing width. Consequently, when including pulse-triggered flip-flops in an integrated circuit, the problem is that the area occupied by the flip-flops in the integrated circuit increases.

BRIEF SUMMARY OF THE INVENTION

A semiconductor integrated circuit device according to one aspect of the present invention has: a first inverter that includes a first transistor configured to charge a charge point based on an input signal, and a second transistor configured to discharge a discharge point based on the input signal; a discharge circuit including a one conductivity-type third transistor and an other conductivity-type fourth transistor with drain-source paths provided in parallel between the charge point and the discharge point; and a second inverter configured to invert a potential of the charge point or the discharge point and supply the inverted potential to gates of the third and fourth transistors; wherein the semiconductor integrated circuit device outputs a delay signal obtained by inverting the input signal by discharge through the discharge circuit.

A semiconductor integrated circuit device according to another aspect of the present invention has: a discharge circuit including a one conductivity-type third transistor and an other conductivity-type fourth transistor with drain-source paths provided in parallel between an input terminal and an output terminal; and a second inverter configured to invert a potential of the input terminal and supply the inverted potential to gates of the third and fourth transistors; wherein the semiconductor integrated circuit device outputs a delay signal of a signal supplied to the input terminal from the output terminal.

Further, a semiconductor integrated circuit device according to another aspect of the present invention includes: a plurality of units constituted by a first inverter including a first transistor configured to charge a charge point based on an input signal and a second transistor configured to discharge a discharge point based on the input signal, and a one conductivity-type third transistor and an other conductivity-type fourth transistor with drain-source paths provided in parallel between the charge point and the discharge point; and a second inverter configured to invert a potential of the charge point or the discharge point of a final stage and supply the inverted potential to gates of the third and fourth transistors in a unit of the final stage among the plurality of units, and obtain a delay signal of the input signal from the charge point or the discharge point; wherein: a potential of the charge point or the discharge point of a unit of a preceding stage is applied as the input signal to the first inverter of a unit of a second or subsequent stage among the plurality of units; and an output of the charge point or the discharge point of a unit of a subsequent stage other than the unit of the final stage among the plurality of units is supplied to gates of the third and fourth transistors of a unit of a preceding stage, to obtain a delay signal of the input signal from the charge point or the discharge point of a unit of an initial stage.

DETAILED DESCRIPTION OF THE INVENTION

Hereunder, embodiments of the present invention are described in detail with reference to the drawings.

First Embodiment

Figure 1:
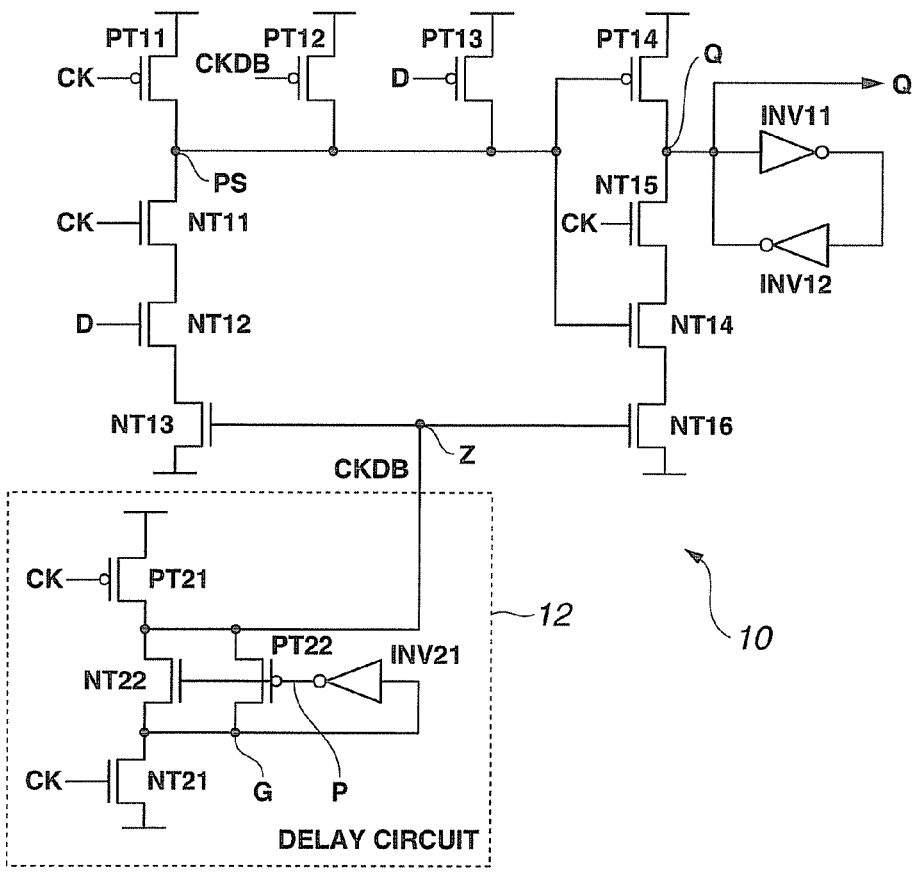
FIG. 1 is a circuit diagram that illustrates a semiconductor integrated circuit device according to a first embodiment of the present invention.

FIG. 1 is a circuit diagram showing a flip-flop circuit that relates to a semiconductor integrated circuit device according to a first embodiment of the present invention.

The present embodiment utilizes a characteristic that a discharge speed of a P-type transistor is slower than a discharge speed of an N-type transistor, and provides a P-type transistor and an N-type transistor in a parallel condition on a discharge channel. The present embodiment is designed such that one part of a discharge time is further delayed by performing discharge via a P-type transistor with respect to one.

A flip-flop circuit (hereunder, referred to as "FF") 10 is a pulse-triggered, single-phase flip-flop. A clock signal CK and a data signal D are input to the FF 10. Upon receiving the clock signal CK, the FF 10 sets a narrow-width pulse period (hereunder, referred to as "transition period") that is synchronized with the clock signal CK. The FF 10 is configured to update a Q output of an output node (state-holding node) Q based on the data signal D in the narrow-width transition period.

Figure 2:
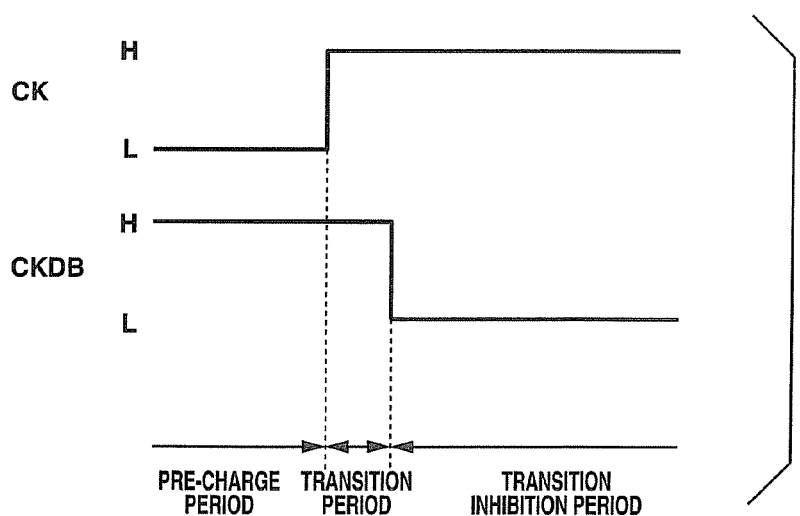
FIG. 2 is an explanatory view for explaining a pre-charge period, a transition period, and a transition inhibition period.

The operations of the FF 10 can be explained by dividing the operations into a pre-charge period, a transition period, and a transition inhibition period. FIG. 2 is an explanatory view for explaining each of the aforementioned periods, and shows a clock signal CK and a clock signal CKDB. The FF 10 delays and inverts a clock signal CK shown in FIG. 2 to generate a clock signal CKDB. A low level (hereunder, referred to as "L level") period of the clock signal CK is a pre-charge period, and an L level period of the clock signal CKDB is a transition inhibition period. A high level (hereunder, referred to as "H level") period of both the clock signal CK and the clock signal CKDB is a transition period.

A pre-charge node PS is connected to a power source terminal Vcc via a drain-source path of a P-type transistor PT11, a drain-source path of a P-type transistor PT12, and a drain-source path of a P-type transistor PT13. The clock signal CK is supplied to the gate of the transistor PT11. The clock signal CKDB is supplied to the gate of the transistor PT12. The data signal D is supplied to the gate of the transistor PT13.

The state of the state-holding node transitions in the transition period. The pre-charge period is set prior to the transition period. The transistor PT11 is turned on by the clock signal CK in the pre-charge period, and charges the pre-charge node PS. In the transition inhibition period, the transistor PT12 is turned on by the clock signal CKDB, and the pre-charge node PS is charged. In the transition period, it is necessary to enable discharging from the pre-charge node PS, and thus the transistors PT11 and PT12 are off.

The pre-charge node PS is connected to a reference potential point via the respective drain-source paths of the N-type transistors NT11, NT12, and NT13 that are connected in series. A discharge passage of the pre-charge node PS is configured by the transistors NT11, NT12, and NT13. The clock signal CK, the data signal D, and the clock signal CKDB are applied to the gates of the transistors NT11, NT12, and NT13, respectively.

In the transition period, the clock signals CK and CKDB are both at H level and the transistors NT11 and NT13 are on. When the data signal D is at H level, the transistor NT12 is also turned on and the charge of the pre-charge node PS is discharged such that the pre-charge node PS changes to L level. When the data signal D is at L level, the transistor NT12 is turned off and the pre-charge node PS maintains the H level state.

The pre-charge node PS is connected to the gates of the P-type transistor PT14 and the N-type transistor NT14. A charge passage of the state-holding node Q is constituted by the transistor PT14. The source of the transistor PT14 is connected to a power source terminal, and the drain thereof is connected to the state-holding node Q. The state-holding node Q is connected to a reference potential point via the respective drain-source paths of the N-type transistors NT14 to NT16 that are connected in series. The discharge passage of the state-holding node Q is constituted by the transistors NT14 to NT16. The clock signal CK is applied to the gate of the transistor NT15, and the clock signal CKDB is applied to the gate of the transistor NT16.

In the transition period, the transistors NT15 and NT16 are on. Accordingly, the potential of the state-holding node Q is determined by the on or off states of the transistors PT14 and NT15. When the pre-charge node PS is at H level, the transistor NT14 is turned on and the transistor PT15 is turned off, and the charge of the state-holding node Q is discharged such that the state-holding node Q changes to L level. When the pre-charge node PS is at L level, the transistor NT14 is turned off and the transistor PT15 is turned on, and the state-holding node Q is charged and changes to H level.

Accordingly, in the transition period, when the data signal D is at H level, the state-holding node Q becomes H level, and when the data signal D is at L level, the state-holding node Q becomes L level. The output of the state-holding node Q is applied to an inverter INV11, and the output of the inverter INV11 is applied to the state-holding node Q via an inverter INV12. The state of the state-holding node Q can be held by means of the inverters INV11 and INV12.

Thus, in the FF 10, the pre-charge node PS is charged in a pre-charge period, and in a transition period the charge of the pre-charge node PS is maintained or discharged based on the data signal D. In accordance with the potential of the pre-charge node PS, the transistors PT14 and NT14 are turned on or off to thereby determine the potential of the state-holding node Q. Thus, the Q output is obtained based on the data signal D.

When the data signal D is not at H level, it is not necessary to discharge the charge of the pre-charge node PS. Thus, the configuration is such that the pre-charge node PS is charged in the transition period also by applying the data signal D to the gate of the transistor PT13.

In order to enable discharge of the pre-charge node PS in the transition period, it is necessary to secure a time that is sufficient as a transition period.

Figure 3:
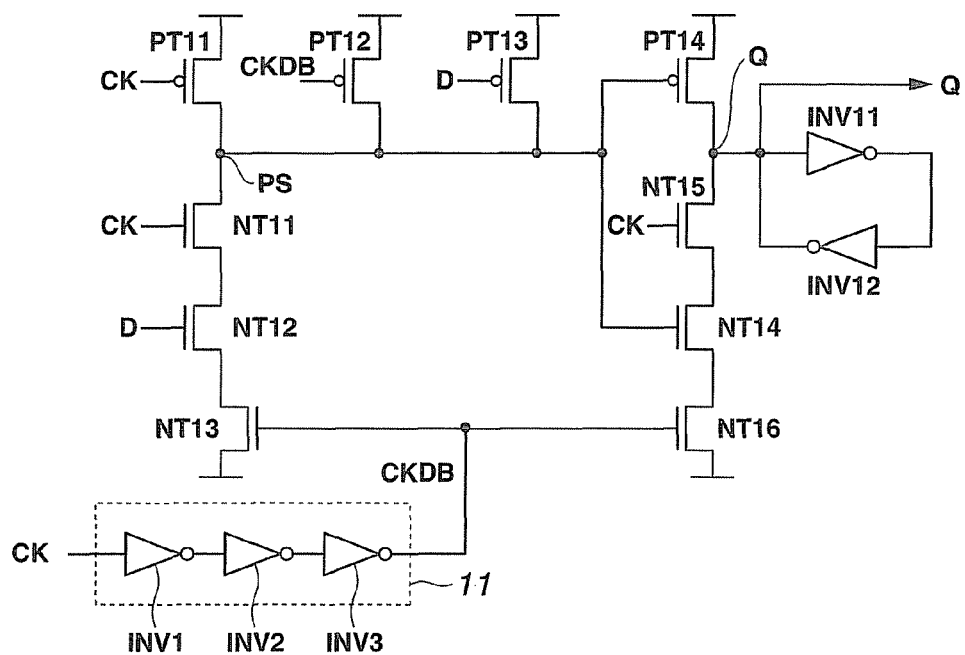
FIG. 3 is a circuit diagram that shows a circuit disclosed by Document 1.

FIG. 3 shows a circuit disclosed in Document 1, in which a dashed line section is a circuit that illustrates a delay circuit that inverts and delays a clock signal CK. The only difference between FIG. 3 and FIG. 1 is that the configuration of a delay circuit 11 in FIG. 3 is different from that of a delay circuit 12 in FIG. 1.

As shown in FIG. 3, the delay circuit 11 is configured by three inverters INV1, INV2, and INV3 that are connected in cascade. A clock signal CK input into the inverter INV1 is delayed while being inverted by the inverters INV1, INV2, and INV3, and a clock signal CKDB is obtained from the inverter INV3.

In contrast, according to the present embodiment, the clock signal CKDB is generated by the delay circuit 12. As shown in FIG. 1, the delay circuit 12 has a P-type transistor PT21 and an N-type transistor NT21 that constitute an inverter. The source of the transistor PT21 is connected to a power source terminal, and the source of the transistor NT21 is connected to a reference potential point. The clock signal CK is supplied to the gates of the transistors PT21 and NT21.

The drain-source path of an N-type transistor NT22 and the source-drain path of a P-type transistor PT22 are connected in parallel between the drain of the transistor PT21 as a charge point and the drain of the transistor NT21 as a discharge point. A discharge circuit is formed by the transistors NT22 and PT22. Further, the drain potential of the transistor NT21 is applied to the inverter INV21. The inverter INV21 is configured so as to invert the inputted potential and supply the inverted potential to the gates of the transistors NT22 and PT22.

Figure 4:
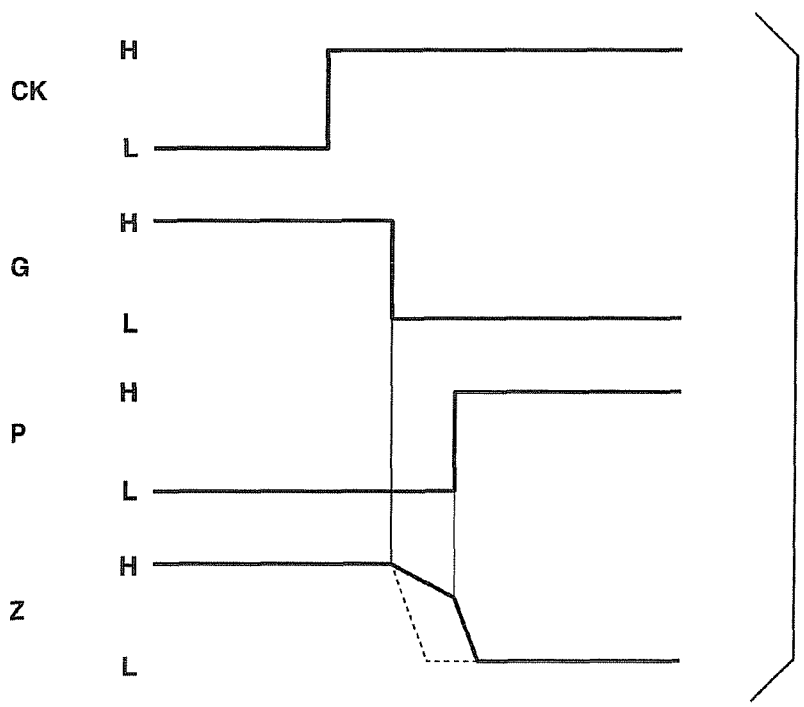
FIG. 4 is a waveform diagram for explaining operations of a delay circuit 12.

Next, the action of the embodiment configured in this manner is described referring to FIG. 4. FIG. 4 is a waveform diagram for describing operation of the delay circuit 12, and shows a signal waveform with respect to the clock signal CK and a G point, a P point, and a Z point in FIG. 1.

The clock signal CK is at L level in a pre-charge period. In this period the transistor PT21 is on, and as shown in FIG. 4, the clock signal CKDB at H level appears at the Z point in FIG. 1. When the clock signal CK becomes H level and a transition period is entered, the transistor PT21 is turned off and the transistor NT21 is turned on. As a result, a charge is discharged at the G point, and as shown in FIG. 4, the potential of the G point becomes L level after a predetermined time from the rising edge of the clock signal CK.

The L level of G point is delayed and inverted by the inverter INV21, and the P point potential shown in FIG. 4 is applied to the gates of the transistors NT22 and PT22. The P point is at L level immediately after the G point has become L level, and in a period until the H level of the G point is transferred to the P point the transistor PT22 is on and the transistor NT21 is off.

More specifically, in this period the transistors PT22 and NT21 are on, and the Z point discharges a charge via the aforementioned transistors PT22 and NT21 and the level thereof falls. When the P point becomes H level, the transistor NT22 turns on and the transistor PT22 turns off. Accordingly, as shown in FIG. 4, from the time that the P point becomes H level onward, the Z point discharges a charge via the transistors NT22 and NT21 and the level thereof falls.

Generally, since the "on" resistance of an N-type transistor is less than that of a P-type transistor and the N-type transistor can rapidly discharge a charge, N-type transistors are used in discharge paths and discharging is performed rapidly. In the present embodiment, because the P-type transistor PT22 is used in the discharge path of the Z point, a comparatively long time is required for discharge at the Z point, and the clock signal CKDB falls after a comparatively long delay time from the rising edge of the clock signal CK. Since complete discharge cannot be expected with only the P-type transistor PT22, ultimately the charge at the Z point is reliably discharged when the N-type transistor NT22 turns on. In this connection, the broken line in FIG. 4 illustrates changes at the Z point when discharge is performed by only the N-type transistor NT22.

Thus, the delay circuit 12 according to the present embodiment can operate with a longer delay time than the delay circuit 11 shown in FIG. 3, and the clock signal CKDB can be obtained that is generated by delaying the clock signal CK by a sufficient time and inverting the signal. In this connection, the delay circuit 12 shown in FIG. 1 can be configured with three P-type transistors and three N-type transistors. More specifically, according to the present embodiment it is possible to form a delay circuit with a longer delay time than the delay circuit shown in FIG. 3 by using the same number of transistors as in the delay circuit 11 shown in FIG. 3, and to set a transition period of a sufficient time.

Second Embodiment

Figure 5:
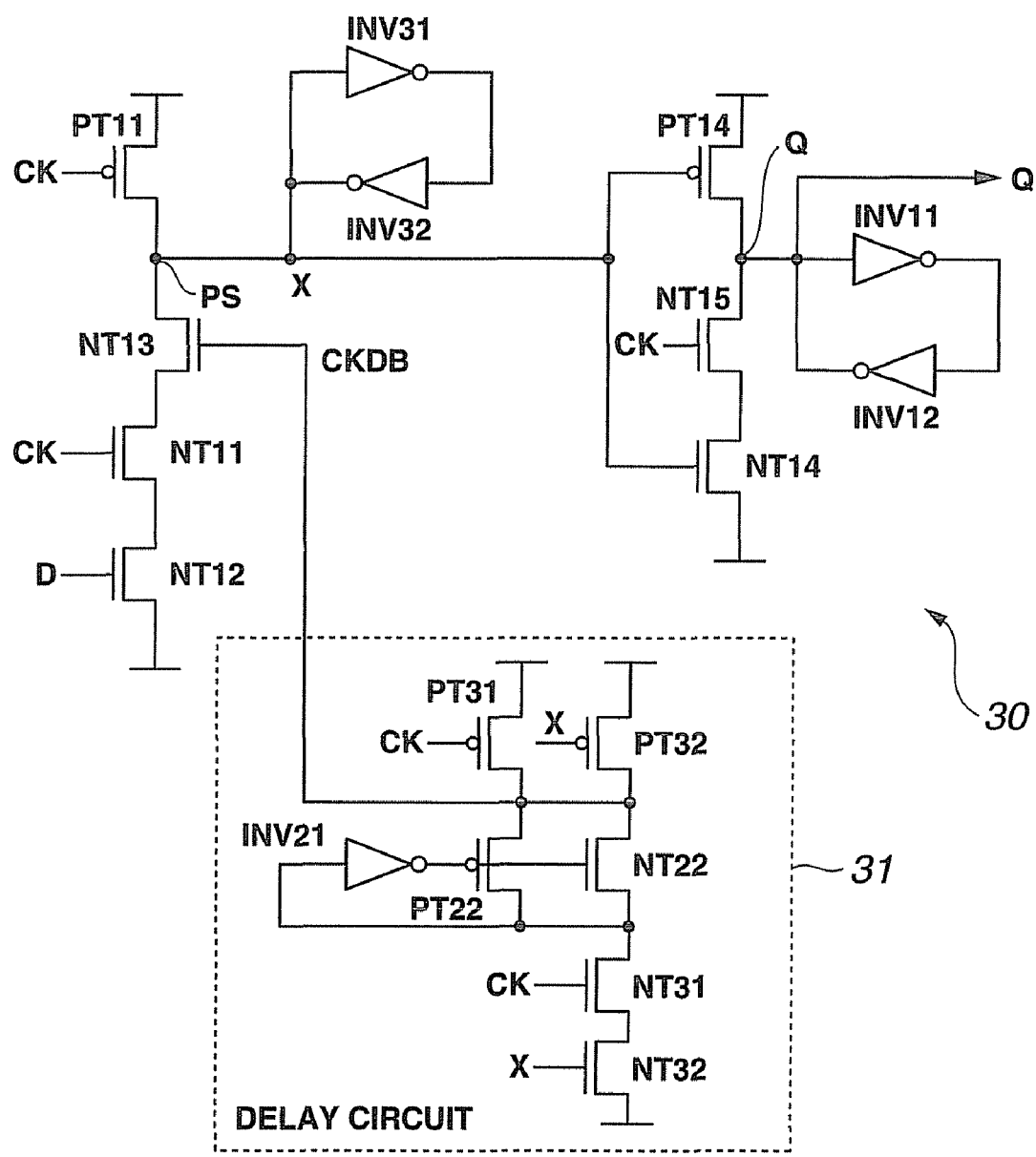
FIG. 5 is a circuit diagram that shows a second embodiment of the present invention.

FIG. 5 is a circuit diagram that shows a second embodiment of the present invention. In FIG. 5, components that are the same as in FIG. 1 are denoted by the same reference numbers, and a description of such components is omitted below.

A flip-flop circuit 30 shown in FIG. 5 differs from the FF 10 of the first embodiment in that the flip-flop circuit 30 employs inverters INV31 and INV32 instead of the transistors PT12 and PT13 and omits the transistor NT16, and also employs a delay circuit 31 instead of the delay circuit 12 of the FF 10.

The potential of the pre-charge node PS is supplied to the inverter INV31. The inverter INV31 inverts the input and outputs the resulting signal to the inverter INV32. The inverter INV32 inverts the input and outputs the resulting signal to the pre-charge node PS.

The basic operations of the FF 30 according to the present embodiment are the same as those of the FF 10 other than the operation of the delay circuit 31, and a detailed description of those basic operations is omitted below.

Figure 6:
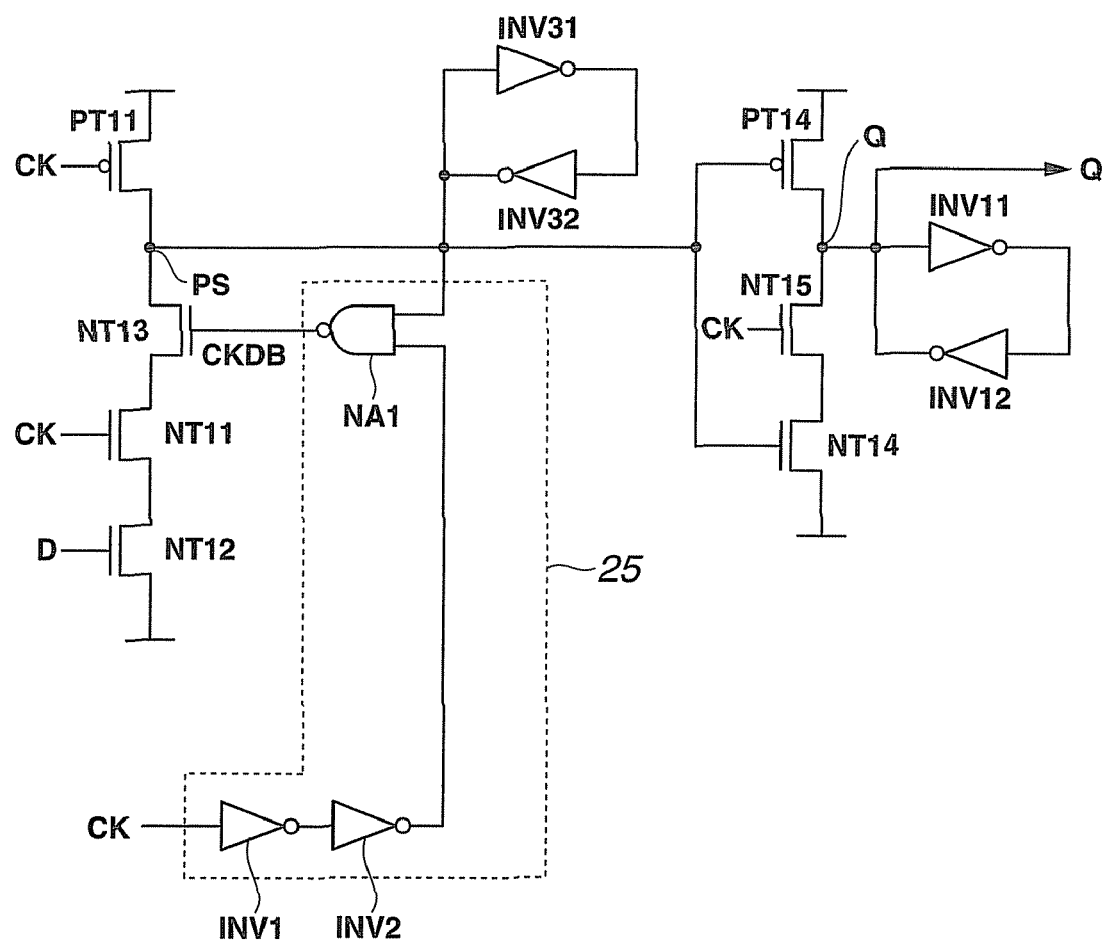
FIG. 6 is a circuit diagram that shows a circuit disclosed by Document 2.

The present embodiment corresponds to a circuit disclosed in Document 2. FIG. 6 is a circuit diagram showing the circuit disclosed in Document 2, in which a dashed line section shows a delay circuit 25 that generates a clock signal CKDB by delaying and inverting a clock signal CK. The FF 30 of the present embodiment employs the delay circuit 31 instead of the delay circuit 25 of the circuit shown in FIG. 6.

The delay circuit 25 shown in FIG. 6 is constituted by inverters INV1 and INV2 and a NAND circuit NA1. A clock signal CK inputted to the inverter INV1 is delayed while being inverted by the inverters INV1 and INV2, and a delay signal of the clock signal CK is supplied from the inverter INV2 to the NAND circuit NA1.

The NAND circuit NA1 is supplied with a potential X of the pre-charge node PS as one input, and is supplied with the output of the inverter INV2 as another input. When the potential X is at H level, the NAND circuit NA1 functions as an inverter, and the delay circuit 25 performs the same operations as the delay circuit 11 in FIG. 3. When the potential X is at L level, the NAND circuit NA1 outputs an H level signal.

According to this configuration, when the data signal D becomes H level and the pre-charge node PS is caused to discharge a charge, the NAND circuit NA1 maintains the clock signal CKDB at H level and forcibly turns a transistor NT13 on to thereby enable reliable discharge of a charge of the pre-charge node PS.

The delay circuit 31 of the present embodiment differs from the delay circuit 12 of the first embodiment in that the delay circuit 31 employs P-type transistors PT31 and PT32 and N-type transistors NT31 and NT32 instead of the transistors PT21 and NT21. The drain-source paths of the transistors PT31 and PT32 are connected between the drain of the transistor NT22 and the power source terminal. The drain-source paths of the transistors NT31 and NT32 are connected between the source of the transistor NT22 and the reference potential point. The drain voltage of the transistor NT22 is supplied to the gate of the transistor NT13 as the clock signal CKDB.

The clock signal CK is supplied to the gate of the transistors PT31 and NT31. The potential X of the pre-charge node PS is supplied to the gate of the transistors PT32 and NT32. A NAND circuit is formed by the transistors PT31, PT32, NT31, and NT32.

When the potential X is at H level, the transistor PT32 is off and the transistor NT32 is on. In this case, in fact, the drain of the transistor NT22 is connected to a power source terminal through the drain-source path of the transistor PT31, and the source of the transistor NT22 is connected to the reference potential point through the drain-source path of the transistor NT31. More specifically, when the potential X is at H level, the transistors PT31, PT32, NT31, and NT32 function as inverters, and the delay circuit 31 performs the same operations as the delay circuit 12 shown in FIG. 1.

In the present embodiment also, the transistor PT22 turns on immediately after the rising edge of the clock signal CK, and the clock signal CKDB falls after a comparatively long delay time from the rising edge of the clock signal CK. Further, ultimately the transistor NT22 turns on and the clock signal CKDB is reliably changed to L level.

In this connection, when the potential X is at L level, the transistor PT32 is on and the transistor NT32 is off. Accordingly, in this case, the drain of the transistor NT22 becomes H level. That is, in this case, the clock signal CKDB is forcibly changed to H level.

Thus, according to the present embodiment, the delay circuit 31 can operate with a longer delay time than the delay circuit 25 shown in FIG. 6 and, similarly to the first embodiment, the clock signal CKDB can be obtained by delaying clock signal CK by a sufficient time and inverting the signal. In this connection, both the delay circuit 31 of the present embodiment and the delay circuit 25 shown in FIG. 6 can be configured with four P-type transistors and four N-type transistors. More specifically, according to the present embodiment it is possible to construct a delay circuit with a longer delay time than the delay circuit 25 shown in FIG. 6 by using the same number of transistors as in the delay circuit shown in FIG. 6, and to set a transition period of a sufficient time.

Third Embodiment

Figure 7:
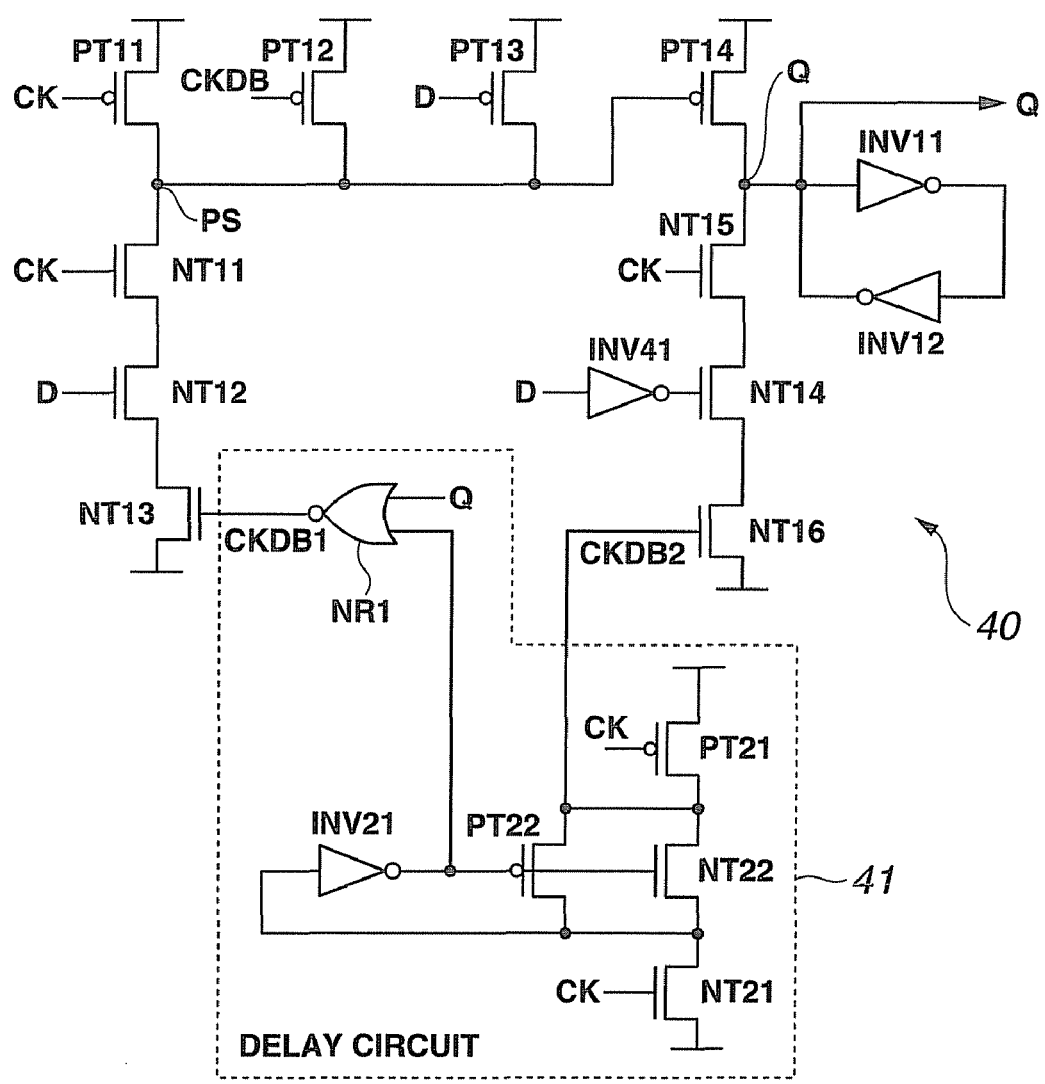
FIG. 7 is a circuit diagram showing a third embodiment of the present invention.

FIG. 7 is a circuit diagram that shows a third embodiment of the present invention. In FIG. 7, components that are the same as in FIG. 1 are denoted by the same reference numbers, and a description of such components is omitted below.

A flip-flop circuit 40 shown in FIG. 7 differs from the FF 10 of the first embodiment in that the flip-flop circuit 40 employs an inverter INV41, and also employs a delay circuit 41 instead of the delay circuit 12 of the FF 10. A data signal D is supplied to the inverter INV41. The inverter INV41 inverts the data signal D and supplies the inverted data to the gate of the transistor NT14. The potential of the pre-charge node PS is supplied only to the gate of the transistor PT14.

In the FF 10 according to the first embodiment, upon input of the data signal D at H level, a charge of the pre-charge node PS is discharged in the transition period, and as a result the transistor PT14 turns on and the state-holding node Q is switched to H level. However, in a case in which the Q output is at H level before input of the data signal D at H level, by maintaining the H level of the state-holding node Q and stopping discharge of the charge of the pre-charge node PS, a correct Q output can be obtained while suppressing the electric power consumption.

To perform this control, the FF 40 has a NOR circuit NR1 inside the delay circuit 41. When the Q output is at H level, the NOR circuit NR1 fixes the output at L level and cuts off the discharge passage of the pre-charge node PS. Further, when the data signal D is at H level, the output of the inverter INV41 becomes L level and the transistor NT14 is turned off. As a result, the charge of the state-holding node Q is prevented from being discharged, and the state-holding node maintains the Q output at H level.

In a case where the data signal D at L level is input when the Q output is at H level, the transistor NT14 is turned on, and the state-holding node Q discharges a charge in the transition period and transitions to L level.

Other operations of the FF 40 are the same as the FF 10.

Figure 8:
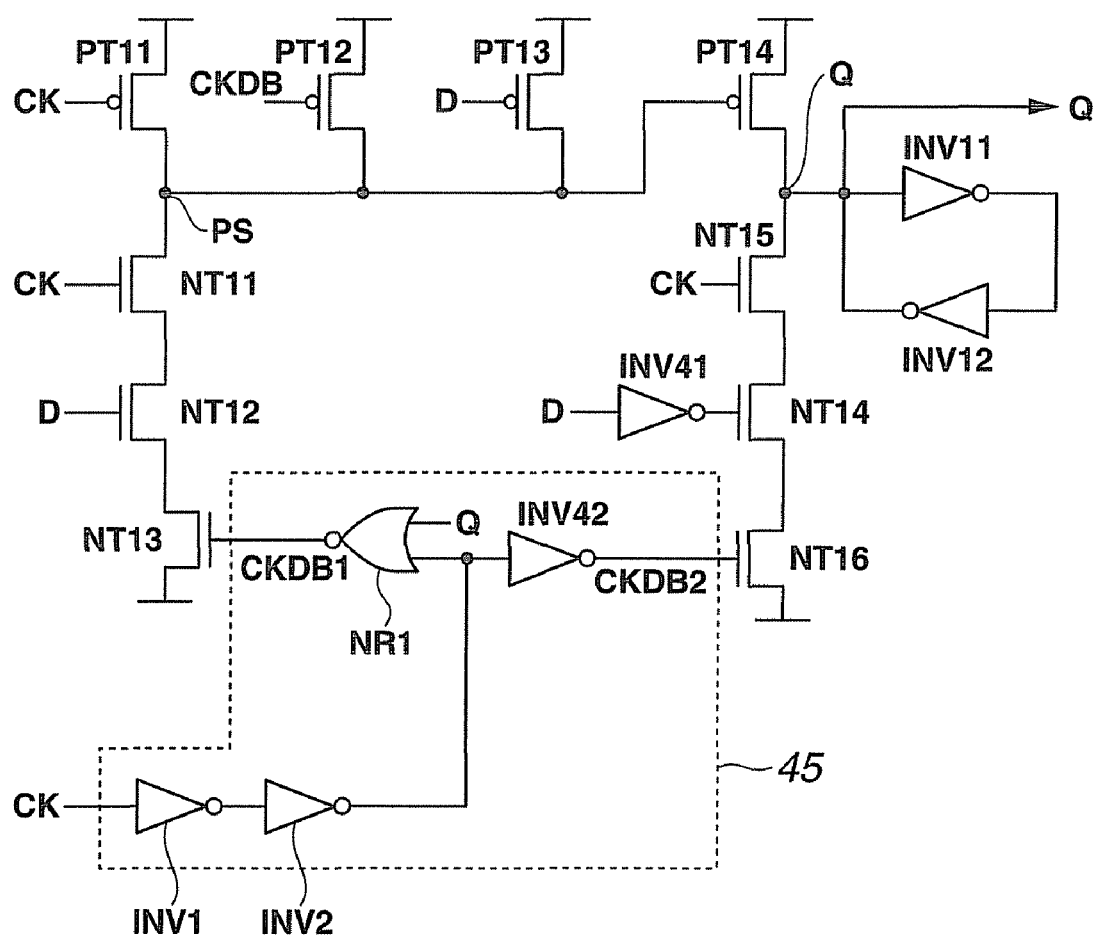
FIG. 8 is a circuit diagram that shows a circuit disclosed by Document 3.

The present embodiment corresponds to a circuit disclosed in Document 3. FIG. 8 is a circuit diagram showing the circuit disclosed in Document 3, in which a dashed line section shows a delay circuit 45 that generates a clock signal CKDB by delaying and inverting a clock signal CK. The FF 40 of the present embodiment employs the delay circuit 41 instead of the delay circuit 45 of the circuit shown in FIG. 8.

The delay circuit 45 shown in FIG. 8 is constituted by inverters INV1, INV2 and INV42 and a NOR circuit NR1. A clock signal CK inputted to the inverter INV1 is delayed while being inverted by the inverters INV1 and INV2, and a delay signal of the clock signal CK is supplied from the inverter INV2 to the NOR circuit NR1 and the inverter INV42. The inverter INV42 supplies a clock signal CKDB2 generated by delaying and inverting the clock signal CK to the gate of the transistor NT16.

The NOR circuit NR1 is supplied with the Q output of the state-holding node Q as one input, and is supplied with the output of the inverter INV2 as another input. When the Q output is at L level, the NOR circuit NR1 functions as an inverter and supplies a clock signal CKDB1 to the gate of the transistor NT13. More specifically, in this case, the delay circuit 45 performs the same operations as the delay circuit 11 shown in FIG. 3. When the Q output is at H level, the NOR circuit NR1 outputs an L level signal.

As described above, according to this configuration, even in a case in which the data signal D becomes H level when the Q output is at H level and discharges a charge of the pre-charge node PS, the NOR circuit NR1 maintains the clock signal CKDB1 at L level and forcibly turns the transistor NT13 off to thereby make it possible to stop discharge of the charge of the pre-charge node PS. In this case, the transistor NT14 is also off.

In contrast, according to the present embodiment, the delay circuit 41 supplies the output of the inverter INV2 to another input terminal of the NOR circuit NR1, and supplies the potential of the drain of the transistor NT22 as the clock signal CKDB2 to the transistor NT16. More specifically, according to the present embodiment also, the transistor PT22 is turned on immediately after the rising edge of the clock signal CK, and the clock signal CKDB2 falls after a comparatively long delay time from the rising edge of the clock signal CK.

Further, ultimately the transistor NT22 is turned on and reliably changes the clock signal CKDB2 to L level.

The output of the inverter INV21 is obtained by delaying the clock signal CK by a delay time of two inverters. When the Q output is at L level, a clock signal CKDB1 generated by delaying the clock signal CK by a delay time of three inverters and inverting the signal is obtained from the NOR circuit NR1.

Further, as described above, the clock signal CKDB2 supplied to the gate of the transistor NT16 is a signal generated by delaying the clock signal CK with a delay time of three inverters or more and inverting the signal by means of the inverters INV1, INV2, and INV42.

Thus, in the present embodiment, the delay circuit 41 operates with a longer delay time than the delay circuit 45 shown in FIG. 8 and, similarly to the first embodiment, a clock signal CKDB2 can be obtained that is generated by delaying the clock signal CK by a sufficient time and inverting the signal. In this connection, both the delay circuit 41 of the present embodiment and the delay circuit 45 shown in FIG. 8 can be configured with five P-type transistors and five N-type transistors. More specifically, according to the present embodiment it is possible to construct a delay circuit that has a longer delay time than the delay circuit shown in FIG. 8 by using the same number of transistors as in the delay circuit 45 shown in FIG. 8.

Fourth Embodiment

Figure 9:
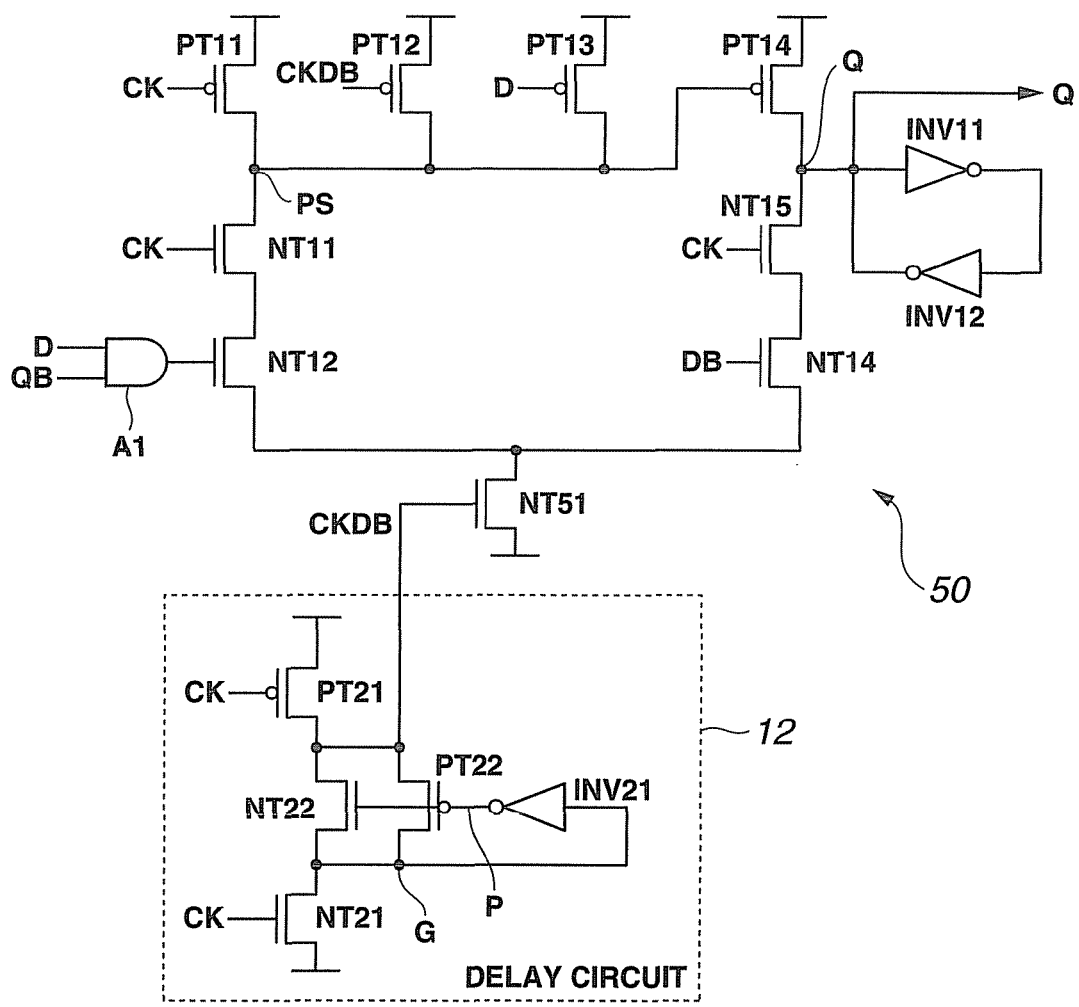
FIG. 9 is a circuit diagram showing a fourth embodiment of the present invention.

FIG. 9 is a circuit diagram that shows a fourth embodiment of the present invention. In FIG. 9, components that are the same as in FIG. 1 are denoted by the same reference numbers, and a description of such components is omitted below.

A flip-flop circuit 50 shown in FIG. 9 differs from the FF 10 of the first embodiment in that an inverted data signal DB obtained by inverting the data signal D is input to the transistor NT14, and that the flip-flop circuit 50 employs an N-type transistor NT51 instead of the transistors NT13 and NT16, and also employs an AND circuit A1.

The AND circuit A1 receives input of inverted QB outputs obtained by inverting the data signal D and the Q output. The AND circuit A1 supplies a result of an AND operation for the two inputs to the gate of the transistor NT12. A drain of the transistor NT51 is commonly connected to the sources of the transistors NT12 and NT14, and the source thereof is connected to a reference potential point. A clock signal CKDB is supplied to the gate of the transistor NT51 from the delay circuit 12.

The basic operations of the FF 50 according to the present embodiment are the same as those of the FF 10. As described above, when the Q output is at H level prior to input of the data signal D that is at H level, by maintaining the H level of the state-holding node Q and stopping discharge of the charge of the pre-charge node PS, the correct Q output can be obtained while suppressing the electric power consumption.

To achieve this control, in the present embodiment the AND of the data signal D and inverted QB output is applied to the gate of the transistor NT12 by the AND circuit A1, and the inverted data signal DB is applied to the transistor NT14. When the inverted QB output is at L level, that is, when the Q output is at H level, the AND circuit A1 outputs an L level signal. Accordingly, even if the data signal D becomes H level when the Q output is at H level, a charge of the pre-charge node PS is not discharged and the transistor NT14 is also turned off. Hence, the charge of the state-holding node Q is not discharged, either. As a result, a correct Q output can be obtained while suppressing electric power consumption by discharge of a charge. In this connection, when the inverted QB output is at H level, the AND circuit A1 applies the data signal D as it is to the gate of the transistor NT12.

Figure 10:
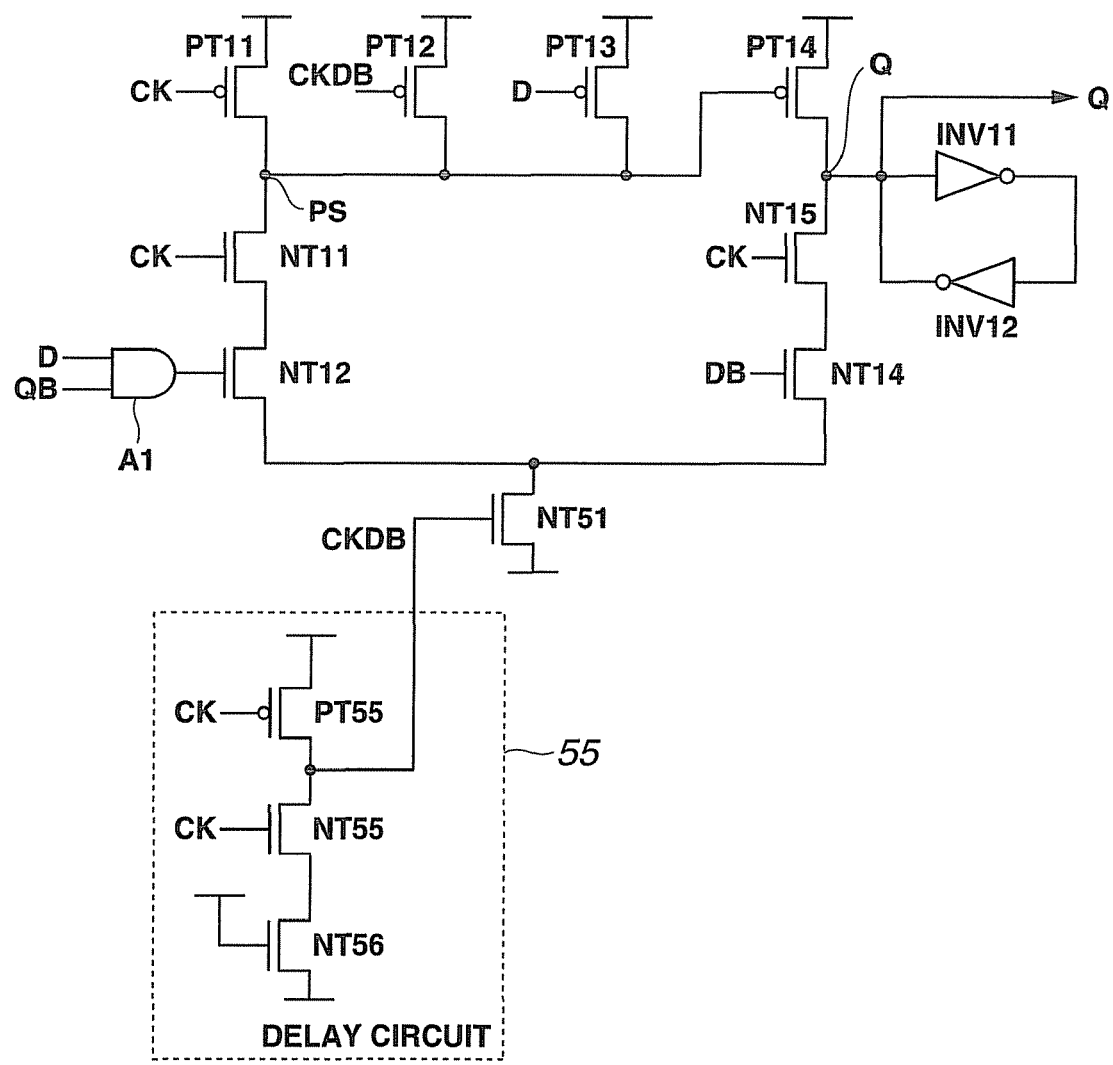
FIG. 10 is a circuit diagram showing a circuit disclosed by related art.

The present embodiment corresponds to a circuit disclosed in Japanese Patent Application No. 2006-158893 (hereunder, referred to as "Document 4"). FIG. 10 is a circuit diagram that shows the circuit disclosed in Document 4. In FIG. 10, the dashed line section illustrates a delay circuit 55 that generates a clock signal CKDB by delaying and inverting a clock signal CK. The FF 50 of the present embodiment employs the delay circuit 12 instead of the delay circuit 55 of the circuit shown in FIG. 10.

The delay circuit 55 shown in FIG. 10 is configured with a P-type transistor PT55, an N-type transistor NT55, and an N-type transistor NT56 constituting an inverter. A source-drain path of the transistor PT55 and drain-source paths of the transistors NT55 and NT56 are connected in series between a power source terminal and a reference potential point. A clock signal CK is supplied to the gates of the transistors PT55 and NT55. A power supply voltage from a power source terminal is supplied to the gate of the transistor NT56.

The transistor NT56 is configured with a sufficiently large gate length. Accordingly, a constant at a time of discharge in the discharge passage by the transistors NT55 and NT56 is sufficiently large, and the clock signal CKDB falls after a sufficient delay time from the rising edge of the clock signal CK. By supplying the clock signal CKDB to the gate of the transistor NT51, a transition period of a sufficient time is ensured.

However, because it is necessary to make the gate length of the transistor NT56 sufficiently large, there is the drawback that the area of the delay circuit 55 increases.

In contrast, according to the present embodiment the output of the delay circuit 12 is supplied to the gate of the transistor NT51 as the clock signal CKDB. The clock signal CKDB falls after a comparatively long delay time from the rising edge of the clock signal CK by means of the P-type transistor PT22. Accordingly, a transition period of a sufficient time can be secured by the delay circuit 12.

Table 1 below shows cell lengths and obtained delay times when the delay circuit 11 shown in FIG. 3, the delay circuit 55 shown in FIG. 10, and the delay circuit 12 shown in FIG. 1 and FIG. 9 are configured as single cells on an integrated circuit.

TABLE 1

| Circuit | Cell length [μm] | Delay [ps] |
| --- | --- | --- |
| Delay circuit 11 | 0.840 | 255 |
| Delay circuit 55 | 0.672 | 229 |
| Delay circuit 12 | 0.672 | 322 |

As shown in Table 1, the delay circuit 12 of the first and fourth embodiments can be constructed with a smaller cell length than the delay circuit 11, and can obtain a longer delay time than the delay circuit 11. Further, the delay circuit 12 can be constructed with the same cell length as the delay circuit 55, and can obtain a longer delay time than the delay circuit 55.

Thus, in the present embodiment, the delay circuit 12 can operate with a longer delay time than the delay circuit 55 shown in FIG. 10 and, similarly to the first embodiment, it is possible to obtain the clock signal CKDB that is generated by delaying the clock signal CK by a sufficient time and inverting the signal, and to secure a transition period of a sufficient time.

Fifth Embodiment

Figure 11:
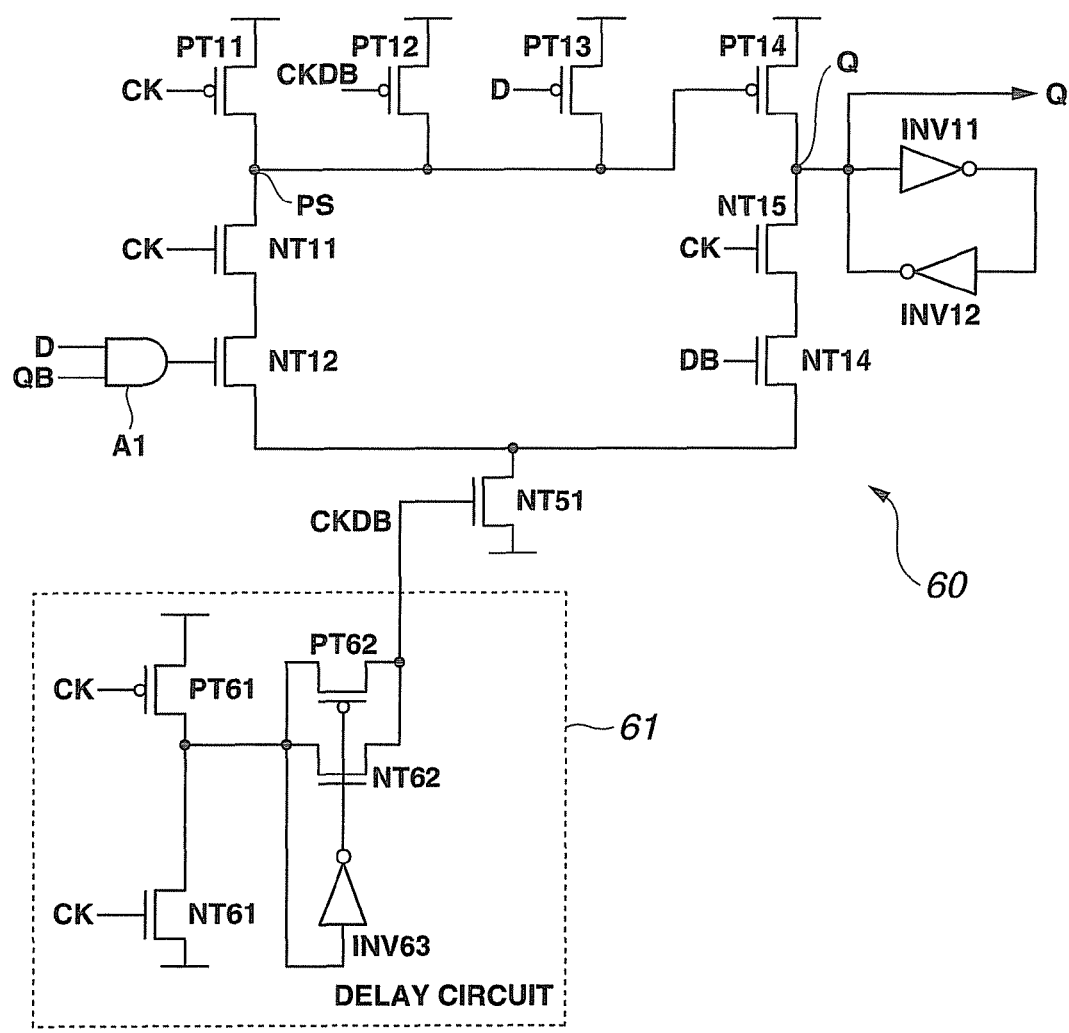
FIG. 11 is a circuit diagram showing a fifth embodiment of the present invention.

FIG. 11 is a circuit diagram that shows a fifth embodiment of the present invention. In FIG. 11, components that are the same as in FIG. 9 are denoted by the same reference numbers, and a description of such components is omitted below.

A flip-flop circuit 60 shown in FIG. 11 differs from the FF 50 of the fourth embodiment in that the flip-flop circuit 60 employs a delay circuit 61 instead of the delay circuit 12. In the delay circuit 61, a source-drain path of a P-type transistor PT61 and a drain-source path of an N-type transistor NT61 that constitute an inverter are serially connected between a power source terminal and a reference potential point. A drain of the transistor PT 61 as a charge/discharge point is connected to the gate of the transistor NT51 via a drain-source path of the P-type transistor PT62 and is also connected in parallel to the gate of the transistor NT51 via the drain-source path of the N-type transistor NT62. The drain potential of the transistor PT61 is supplied to an inverter INV63. The inverter INV63 inverts the input and supplies the inverted input to the gates of the transistors PT62 and NT62.

Operations that are the same as those in the waveform diagram shown in FIG. 4 are also performed by the delay circuit 61 configured in this manner. More specifically, when the clock signal CK changes from L level to H level, the drain potential of the transistor PT61 becomes L level after a delay of a predetermined time, and after a further delay of a predetermined time the output of the inverter INV63 becomes H level.

When the drain potential of the transistor PT61 becomes L level, the transistor PT62 is turned on and the gate potential of the transistor NT51 is decreased. A comparatively longer time is required by the P-type transistor PT62 in order for the gate potential to be lowered sufficiently. When the output of the inverter INV63 becomes H level, the transistor PT62 turns off and the transistor NT62 turns on, and the gate potential of the transistor NT51 is completely transitioned to L level.

Thus, the delay circuit 61 of the present embodiment performs the same operations as the delay circuit 12 in each of the foregoing embodiments. Similarly to the delay circuit 12, the delay circuit 61 can also be configured with three P-type transistors and three N-type transistors.

When considering only the number of transistors, the delay circuit 61 shown in FIG. 11 is the same as the delay circuit 11 of FIG. 3 described in Document 1 and the like. However, the present embodiment provides the advantage that the delay circuit 61 can be formed with a shorter cell length than the delay circuit 11 shown in FIG. 3.

Figure 12:
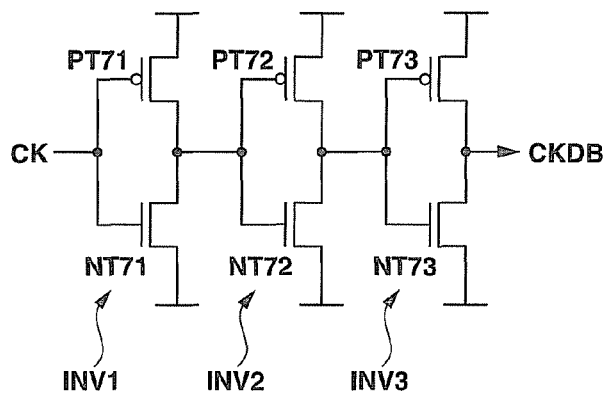
FIG. 12 is a circuit diagram showing a circuit configuration of a delay circuit 11.
Figure 13:
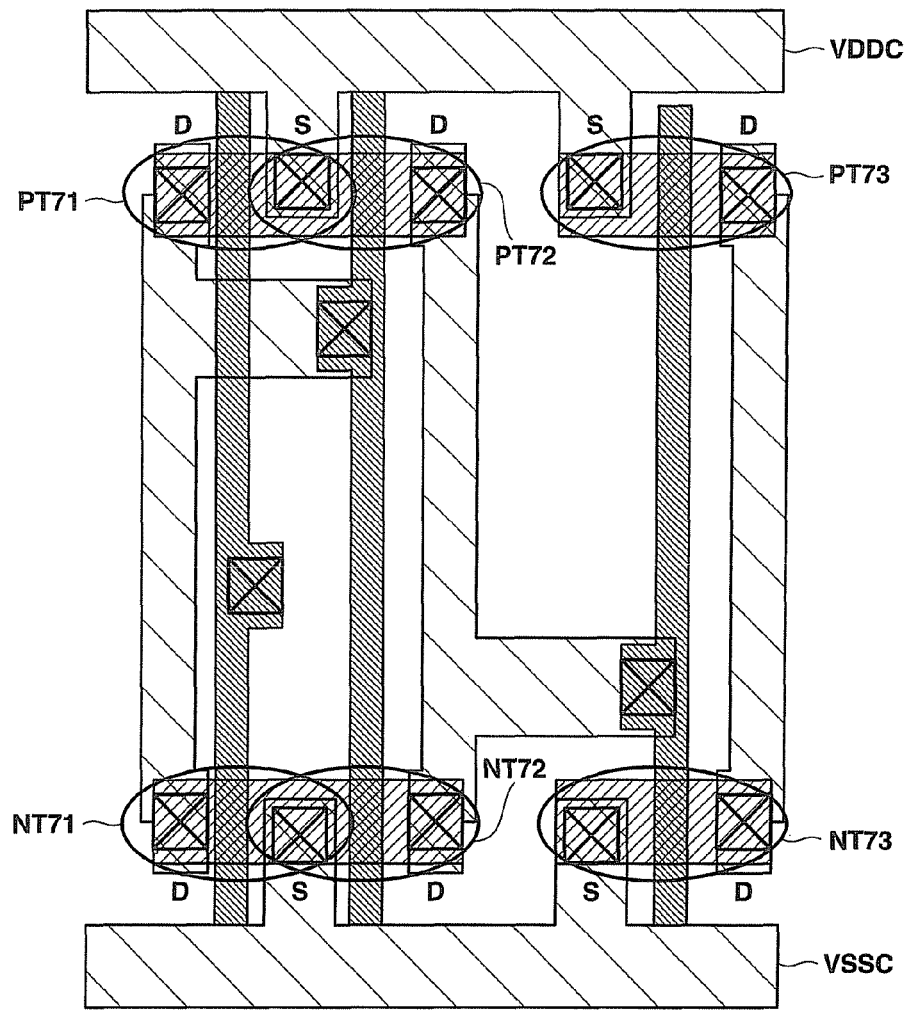
FIG. 13 is an explanatory view that shows a pattern layout of the delay circuit 11.
Figure 14:
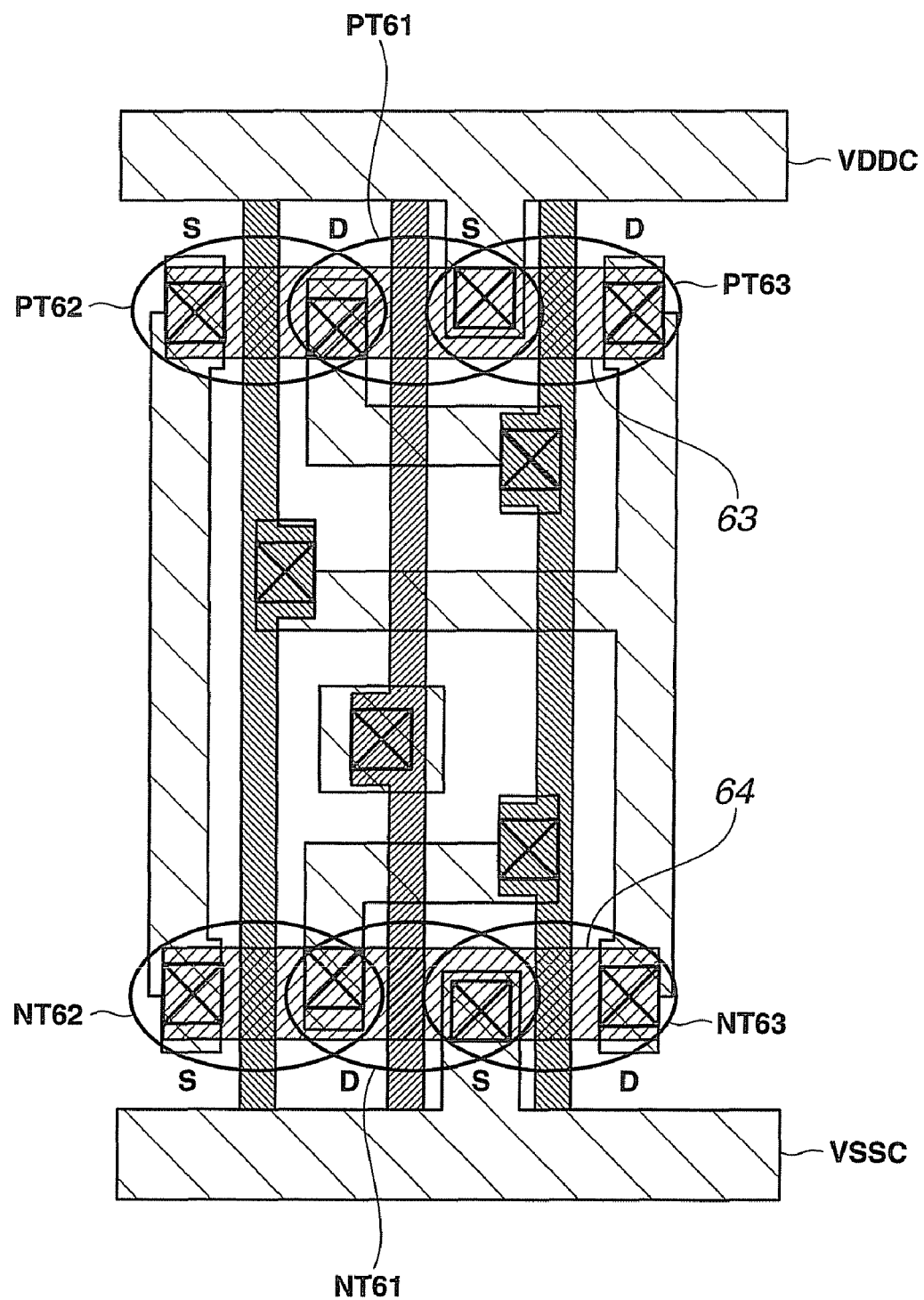
FIG. 14 is an explanatory view that shows a pattern layout of a delay circuit 61 according to the embodiments.

FIGS. 12 to 14 are views for explaining this advantage. FIG. 12 is a circuit diagram showing a circuit configuration of the delay circuit 11. FIG. 13 is an explanatory view showing a pattern layout of the delay circuit 11. FIG. 14 is an explanatory view showing a pattern layout of the delay circuit 61 according to the present embodiment. In FIG. 13 and FIG. 14, the difference between members is represented by the density or coarseness of the hatching. The densest hatching indicates a gate, and the coarsest hatching indicates metal wiring. Active regions are indicated by hatching that has an intermediate degree of density and coarseness. Reference characters S and D in FIG. 13 and FIG. 14 denote a source region and a drain region, respectively. An X mark surrounded by a square frame in FIG. 13 and FIG. 14 denotes a contact. Further, in FIG. 13 and FIG. 14, a region corresponding to a transistor on a circuit diagram is indicated by being surrounded by an elliptical shape.

As shown in FIG. 12, inverters INV1 to INV 3 configuring the delay circuit 11 are constituted by P-type transistors PT71 to PT73 and N-type transistors NT71 to NT73. In general, a semiconductor integrated circuit is divided into a P-well and an N-well. In FIG. 13, a P-well is formed on a power supply line VDDC side, and an N-well is formed on a reference potential line VSSC side. The P-type transistors PT71 to PT73 are included in the P-well. The N-type transistors NT71 to NT73 are included in the N-well. Since a delay circuit is provided for each flip-flop, when the pattern in FIG. 13 is considered to be a single cell, a plurality of cells are arranged in succession on the integrated circuit.

A source region S of the transistors PT71 and PT72 is commonly connected to the power supply line VDDC. Further, a source region S of the transistors NT71 and NT72 is commonly connected to the reference potential line VSSC. More specifically, the active region of the transistors PT71 and PT72 is common, and the active region of the transistors NT71 and NT72 is also common. However, since it is necessary to connect the respective source regions S of the transistors PT73 and NT73 to the power supply line VDDC or the reference potential line VSSC, the transistors PT73 and NT73 are arranged in respectively independent active regions.

Accordingly, the delay circuit 11 has the drawback that active regions are segmented within a single cell, and thus the cell length increases.

In contrast, FIG. 14 illustrates the layout of the delay circuit 61.

The inverter INV63 in the delay circuit 61 in FIG. 11 is constituted by the P-type transistor PT63 and the N-type transistor NT63 as shown in FIG. 14. An active region 63 is formed in a P-well on the power supply line VDDC side, and an active region 64 is formed in an N-well on the reference potential line VSSC side.

A source region S, a drain region D, a source region S, and a drain region D are formed in sequence in the active region 63. Gates are formed between these regions, and P-type transistors PT62, PT61, and PT63 are formed in the active region 63. Further, a source region S, a drain region D, a source region S, and a drain region D are formed in sequence in the active region 64. Gates are formed between these regions, and N-type transistors NT62, NT61, and NT63 are formed in the active region 64.

In the active region 63, the transistors PT61 and PT62 have a common drain region D, and the transistors PT61 and PT63 have a common source region S. In the active region 64, the transistors NT61 and NT62 have a common drain region D, and the transistors NT61 and NT63 have a common source region S.

The clock signal CK is supplied to a common gate of the transistors PT61 and PT62. The drain region D of the transistor PT61 is connected to a common gate of the transistors PT63 and NT63, and is connected to the drain region D of the transistor NT62 via the common gate. The drain region D of the transistor PT61 is common with the drain region D of the transistor PT62. The drain region D of the transistor PT63 and the drain region D of the transistor NT63 are commonly connected, and are connected to a common gate of the transistors PT62 and NT62. The source region S of the transistor PT62 and the source region S of the transistor NT62 are commonly connected, and the clock signal CKDB is output from that connection point.

Thus, in the delay circuit 61, it is possible to make common the source region S of the transistors PT61 and PT63 that is connected to the power supply line VDDC, and to make common the source region S of the transistors NT61 and NT63 that is connected to the reference potential line VCCS. It is also possible to make common the drain region D of the transistors PT61 and PT62, and to make common the drain region D of the transistors NT61 and NT62. Therefore, the three transistors PT61 to PT63 can be configured in a single active region 63 constituting a P-well, and the three transistors NT61 to NT63 can be configured in a single active region 64 constituting an N-well.

Thus, according to the present embodiment, since transistors can be formed in the single active region 63 and the single active region 64 without segmenting the respective active regions 63 and 64, the cell length can be made shorter than in the layout shown in FIG. 13. Further, as shown in Table 1, while the cell length of the delay circuit 11 is 0.840 μm, the cell length of the delay circuit 61 is 0.672 μm which is the same as the cell length of the delay circuit 12. More specifically, according to the present embodiment, a delay circuit with a large delay time can be formed that has a smaller circuit area than in the conventional technology.

Modification Example

Figure 15:
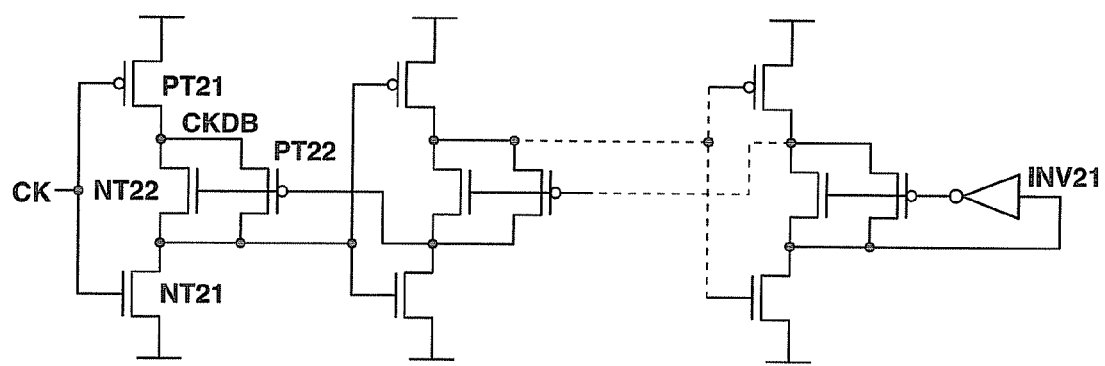
FIG. 15 is a circuit diagram that shows a modification example of a delay circuit.

FIG. 15 is a circuit diagram that shows a modification example of a delay circuit. In FIG. 15, components that are the same as in FIG. 1 are denoted by the same reference numbers, and a description of such components is omitted below. The delay circuit shown in FIG. 15 is a circuit in which the transistors PT21, NT21, PT22, and NT22 of the delay circuit 12 are connected in cascade. In this connection, reference numbers of transistors of the second and subsequent stages are omitted from the drawing.

The clock signal CK is transmitted by transistors PT21 and NT21 constituting an inverter to the gate of transistors PT21 and NT21 at the next stage. Output of the inverter INV21 is transitioned by the clock signal CK that is applied to the gate of the transistors PT21 and NT21 at the final stage. On and off states of the transistors PT22 and NT22 at the final stage are controlled according to the output of the inverter INV21, and the potential of the drain of the transistor NT22 is supplied to the gate of the transistors PT22 and NT22 at the preceding stage. Thus, the clock signal CKDB is obtained from the drain of the transistor NT22 at the initial stage.

A large delay time can be obtained by this configuration.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A semiconductor integrated circuit device, comprising:
a first inverter comprised by a first transistor configured to charge a charge point based on an input signal, and a second transistor configured to discharge a discharge point based on the input signal;
a discharge circuit comprised by a one conductivity-type third transistor and an other conductivity-type fourth transistor with drain-source paths provided in parallel between the charge point and the discharge point; and
a second inverter configured to invert a potential of the charge point or the discharge point and supply the inverted potential to gates of the third and fourth transistors;
wherein the semiconductor integrated circuit device outputs a delay signal obtained by inverting the input signal by discharge through the discharge circuit.

2. The semiconductor integrated circuit device according to claim 1, comprising a fifth transistor and a sixth transistor that comprise a NAND circuit together with the first and second transistors.

3. The semiconductor integrated circuit device according to claim 2, comprising:
a pre-charge node whose level is controlled based on a data signal after a pre-charge operation;
a first charge channel configured to charge a state-holding node based on the level of the pre-charge node;
a first discharge channel configured to discharge the state-holding node based on the level of the pre-charge node; and
a switching section configured to discharge the pre-charge node based on a data signal in a transition period that is based on the input signal and the delay signal;
wherein the switching section has a switching element whose conduction or non-conduction is controlled by the NAND circuit to which the level of the pre-charge node and the input signal is applied.

4. The semiconductor integrated circuit device according to claim 1, comprising a NOR circuit to which an output of the second inverter is supplied.

5. The semiconductor integrated circuit device according to claim 4, comprising:
a pre-charge node whose level is controlled based on a data signal after a pre-charge operation;
a first charge channel configured to charge a state-holding node based on the level of the pre-charge node;
a first discharge channel configured to discharge the state-holding node based on the data signal; and
a switching section configured to discharge the pre-charge node based on a data signal in a transition period that is based on the input signal and the delay signal;
wherein the switching section has a switching element whose conduction or non-conduction is controlled by the NOR circuit to which a level of the state-holding node and an output of the second inverter is applied.

6. The semiconductor integrated circuit device according to claim 1, comprising:
a first charge channel configured to charge a state-holding node;
a first discharge channel configured to discharge the state-holding node; and
a switching section configured to bring into conduction any one of the first charge channel and the first discharge channel based on a data signal in a transition period based on the input signal and the delay signal.

7. The semiconductor integrated circuit device according to claim 6, wherein the switching section becomes conductive or non-conductive depending on a level of a pre-charge node that is controlled based on the data signal.

8. The semiconductor integrated circuit device according to claim 7,
wherein the switching section comprises:
a first switching element configured to become conductive or non-conductive based on the input signal;
a second switching element configured to become conductive or non-conductive based on a level of the pre-charge node; and
a third switching element configured to become conductive or non-conductive based on the delay signal.

9. The semiconductor integrated circuit device according to claim 6,
wherein the switching section comprises:
a first switching element configured to become conductive or non-conductive based on the input signal;

a second switching element configured to become conductive or non-conductive based on the data signal; and a third switching element configured to become conductive or non-conductive based on the delay signal.

10. The semiconductor integrated circuit device according to claim 1, comprising:

a pre-charge node whose level is controlled based on a data signal after a pre-charge operation;

a first charge channel configured to charge a state-holding node based on the level of the pre-charge node; and a switching section configured to discharge the pre-charge node based on a data signal in a transition period that is based on the input signal and the delay signal;

wherein the switching section comprises:

a first switching element configured to become conductive or non-conductive based on the input signal;

a second switching element whose conduction or non-conduction is controlled by an output of an AND circuit to which the data signal and a level of the state-holding node is applied; and a third switching element configured to become conductive or non-conductive based on the delay signal.

11. The semiconductor integrated circuit device according to claim 1, wherein:

the first and second inverters each comprise a one conductivity-type transistor and an other conductivity-type transistor;

the one conductivity-type transistors in the first and second inverter, and the third transistor are arranged in a first active region; and the other conductivity-type transistors in the first and second inverters, and the fourth transistor are arranged in a second active region.

12. A semiconductor integrated circuit device, comprising:

a discharge circuit comprised by a one conductivity-type first transistor and an other conductivity-type second transistor with drain-source paths provided in parallel between an input terminal and an output terminal; and a first inverter configured to invert a potential of the input terminal and supply the inverted potential to gates of the first and second transistors;

wherein the semiconductor integrated circuit device outputs a delay signal of a signal supplied to the input terminal from the output terminal.

13. The semiconductor integrated circuit device according to claim 12, comprising:

a second inverter comprised by a third transistor configured to charge a charge/discharge point connected to the input terminal based on an input signal, and a fourth transistor configured to discharge the charge/discharge point based on the input signal.

14. The semiconductor integrated circuit device according to claim 13, comprising:

a first charge channel configured to charge a state-holding node;

a first discharge channel configured to discharge the state-holding node; and a switching section configured to bring into conduction any one of the first charge channel and the first discharge channel based on a data signal in a transition period based on the input signal and the delay signal.

15. The semiconductor integrated circuit device according to claim 14, wherein the switching section becomes conductive or non-conductive depending on a level of a pre-charge node that is controlled based on the data signal.

16. The semiconductor integrated circuit device according to claim 14, wherein the switching section comprises:

a first switching element configured to become conductive or non-conductive based on the input signal;

a second switching element whose conduction or non-conduction is controlled by an AND circuit to which the data signal and a level of the state-holding node is applied; and a third switching element configured to become conductive or non-conductive based on the delay signal.

17. The semiconductor integrated circuit device according to claim 13, wherein:

the first and second inverters each comprise a one conductivity-type transistor and an other conductivity-type transistor;

the one conductivity-type transistors in the first and second inverters, and the first transistor are arranged in a first active region; and the other conductivity-type transistors in the first and second inverters, and the second transistor are arranged in a second active region.

18. The semiconductor integrated circuit device according to claim 17, wherein:

in the first active region:

two source regions among three source regions of the one conductivity-type transistors in the first and second inverters and the first transistor are shared, and two drain regions among three drain regions of the one conductivity-type transistors in the first and second inverters and the first transistor are shared; and in the second active region:

two source regions among three source regions of the other conductivity-type transistors in the first and second inverters and the second transistor are shared, and two drain regions among three drain regions of the other conductivity-type transistors in the first and second inverters and the second transistor are shared.

19. The semiconductor integrated circuit device according to claim 12, comprising:

a first charge channel configured to charge a state-holding node;

a first discharge channel configured to discharge the state-holding node; and a switching section configured to bring into conduction any one of the first charge channel and the first discharge channel based on a data signal in a transition period based on the input signal and the delay signal.

20. A semiconductor integrated circuit device, comprising:

a plurality of units comprised by a first inverter including a first transistor configured to charge a charge point based on an input signal and a second transistor configured to discharge a discharge point based on the input signal, and a one conductivity-type third transistor and an other conductivity-type fourth transistor with drain-source paths provided in parallel between the charge point and the discharge point; and a second inverter configured to invert a potential of the charge point or the discharge point of a final stage and supply the inverted potential to gates of the third and fourth transistors in a unit of the final stage among the plurality of units, and obtain a delay signal of the input signal from the charge point or the discharge point;

wherein:

a potential of the charge point or the discharge point of a unit of a preceding stage is applied as the input signal to the first inverter of a unit of a second or subsequent stage among the plurality of units; and an output of the charge point or the discharge point of a unit of a subsequent stage other than the unit of the final stage among the plurality of units is supplied to gates of the third and fourth transistors of a unit of a preceding stage, to obtain a delay signal of the input signal from the charge point or the discharge point of a unit of an initial stage.

* * * * *